United States Patent [19]

Roth et al.

[11] Patent Number: 4,947,235
[45] Date of Patent: Aug. 7, 1990

[54] INTEGRATED CIRCUIT SHIELD

[75] Inventors: Norman J. Roth, Kokomo, Ind.; Robert J. Wallace, Southfield; Domenica N. Hartman, Plymouth, both of Mich.

[73] Assignee: Delco Electronics Corporation, Kokomo, Ind.

[21] Appl. No.: 312,800

[22] Filed: Feb. 21, 1989

[51] Int. Cl.⁵ .................. H01L 11/00; H01L 15/00
[52] U.S. Cl. ........................................ 357/68; 357/84
[58] Field of Search ................................ 357/84, 80

[56] References Cited

U.S. PATENT DOCUMENTS

| | | | |
|---|---|---|---|
| 3,616,546 | 10/1971 | Avins | 357/84 |
| 3,754,170 | 8/1973 | Tsuda et al. | 357/84 |
| 4,423,548 | 1/1984 | Hulseweh | 357/74 |
| 4,514,749 | 4/1985 | Shoji | 357/84 |
| 4,559,579 | 12/1985 | Val | 357/23.13 |
| 4,661,837 | 4/1987 | Sono | 357/84 |

FOREIGN PATENT DOCUMENTS

| | | |
|---|---|---|
| 0303974 | 2/1989 | European Pat. Off. ......... 357/84 |
| 0104243 | 6/1982 | Japan . |
| 57464 | 4/1984 | Japan . |
| 0205740 | 11/1984 | Japan . |

Primary Examiner—Andrew J. James
Assistant Examiner—Viet Q. Nguyen
Attorney, Agent, or Firm—Domenica N. S. Hartman

[57] ABSTRACT

Propagation of electromagnetic interference waves is eliminated or substantially reduced by providing an electromagnetic interference shield suitable for shielding electromagnetic interference or radio frequency interference which are generated by offending components on a monolithic integrated circuit chip. The shield is disposed over the offending components of the integrated circuit and is sufficiently large to eliminate or substantially reduce the propagation of any offending interference waves. Alternatively, the shield may be disposed over a non-offending component to prevent radiated electromagnetic interference from entering the non-offending component. The shield is electrically conductive and maintained at a predetermined, primarily constant, electrical potential with respect to the underlying integrated circuit chip. The shield is integral with the electrically conductive tape used with tape automated bonding manufacturing techniques, or, in an alternative embodiment, the flexible conductive circuitry pattern used with flexible circuitry manufacturing techniques.

6 Claims, 3 Drawing Sheets

INTEGRATED CIRCUIT SHIELD

FIELD OF THE INVENTION

This invention relates to the design of an integrated circuit shield which is suitable for shielding electromagnetic interference from radio frequency generating components on an integrated circuit chip. More particularly, this invention relates to the design of an integrated circuit shield which is compatible with either tape automated bonding or flexible circuitry manufacturing techniques.

BACKGROUND OF THE INVENTION

As the size of electrical components and the corresponding distance between these components on an integrated circuit decreases, all while electrical complexity of the integrated circuit increases, electromagnetic interference becomes a more serious threat to the electrical integrity of these integrated circuits.

In general, electromagnetic interference waves are produced by electrical and magnetic processes, such as the making and breaking of circuits, spark discharges and, also, atmospheric interference, such as thunderstorms. In addition, the high frequency turning on and off of electronic circuits, loose contacts in electrical leads, poor or intermittent metallic contact between metal bonds and components, and electrostatic charges may also produce these undesirable electromagnetic interference waves. In an integrated circuit, radio frequency generating components may cause electromagnetic interference with other nearby circuits on that same integrated circuit or cause electromagnetic interference with other nearby circuits.

The electromagnetic interference waves, usually in the form of pulses, have a wide frequency spectrum. They may enter an electronic circuit by radiation or conduction from a nearby circuit or from other remote electronic units. Likewise, an integrated circuit can emit electromagnetic interference by radiation or conduction which might affect the operation of other electronic circuits. These interference waves may enter directly into an integrated circuit if the integrated circuit is poorly shielded.

One method for decreasing this undesirable electromagnetic interference, which is generated or received, is to shield or screen the affected electrical circuits from the offending components which are generating the interference waves. Shielding or screening is the complete surrounding of the offending electrical system causing the interference or, alternatively, the offended system receiving the interference, by means of a cover made from an appropriate material. The shielding effect of the material is dependent on the conductivity and magnetic permeability of the material, as well as the frequency of the interference waves. Practically all metals are therefore suitable shielding materials. In addition, shields formed from conductive plastics and/or conductive coatings on an appropriate plastic have also been used to shield the effected, non-offending components from the offending components generating the electromagnetic interference.

Good shielding of the non-offending system prevents the interference waves from passing directly into the non-offending integrated circuit or receiver. This is effective; however, it is desirable to prevent any and all propagation of the interference waves. This could be accomplished by eliminating or considerably reducing the interference waves at their point of origin, such as by shielding the offending system, i.e., the radio frequency generating component on an integrated circuit, not the non-offending system. However, at times, it is not possible or practical to shield the offending system; therefore, it may be desirable to shield the offending system or integrated circuit from receiving the radiated interference.

In addition, it is desirable that the electromagnetic interference shield be compatible with manufacturing techniques currently used to form integrated circuits. Many methods are known for forming the electrical interconnections between an integrated circuit and the supporting substrate. Tape automated bonding (TAB) is one commonly known method for forming these such electrical interconnections, wherein a plurality of bonds are formed simultaneously on an integrated circuit using thermocompression gang bonding techniques. In an alternative bonding method, a flexible circuit (FLEX) is used to form the electrical interconnections between the integrated circuit in the substrate, the substrate being an integral part of the flexible circuit itself.

It is, therefore, advantageous to provide an electromagnetic interference shield which eliminates the interference waves at their point of origin, thereby preventing propagation of the interference waves to non-offending electrical systems or, alternatively, provides a shield to an integrated circuit from receiving radiated electromagnetic interference. In addition, it is advantageous that the provided for electromagnetic interference shield be compatible with the tape automated bonding technologies or the flexible circuitry manufacturing technologies.

SUMMARY OF THE INVENTION

It is, therefore, an object of this invention to provide an electromagnetic interference shield which substantially eliminates the interference waves at their point of origin, thereby preventing propagation of the interference waves or, alternatively, providing a shield to prevent radiated electromagnetic interference from entering an integrated circuit.

It is a further object of this invention to provide an electromagnetic interference shield which is compatible with either the tape automated bonding or flexible circuitry manufacturing technologies.

In accordance with a preferred embodiment of this invention, these and other objects and advantages are accomplished as follows.

This invention comprehends an electromagnetic interference shield suitable for shielding electromagnetic interference or radio frequency interference which are generated by offending components on a monolithic integrated circuit chip or, alternatively, to protect non-offending components from receiving the interference generated by offending components. The shield is electrically conductive and is provided over the offending radio frequency generating components of the integrated circuit or, in the alternative, over the non-offending components sought to be protected. The shield is sufficiently large to eliminate or substantially reduce the propagation of any offending interference waves. The shield is maintained at a predetermined, primarily constant, electrical potential with respect to the integrated circuit chip. In addition, the shield is integral with the electrically conductive tape used in tape automated bonding manufacturing techniques or, in an alternative embodiment, the flexible conductive circuitry pattern used with flexible circuitry manufacturing techniques.

Other objects and advantages of this invention will be appreciated from a detailed description thereof, which follows.

BRIEF DESCRIPTION OF THE DRAWINGS

The following detailed description of the invention may be best understood when reference is made to the accompanying drawing.

DETAILED DESCRIPTION

In accordance with this invention, propagation of electromagnetic interference waves is eliminated or substantially reduced by providing an electromagnetic interference shield suitable for shielding electromagnetic interference or radio frequency interference which are generated by offending components on a monolithic integrated circuit chip. The shield is disposed over the offending area of the integrated circuit and is sufficiently large to eliminate or substantially reduce the propagation of any offending interference waves. The shield is electrically conductive and maintained at a predetermined, primarily constant, electrical potential, preferably ground potential, with respect to the underlying integrated circuit chip. Alternatively, the shield may be provided over the non-offending component to protect it from receiving interference generated elsewhere on the integrated circuit or generated from external components.

An inventive feature of this invention is that the shield is integral with the electrically conductive tape used with tape automated bonding manufacturing techniques or, in an alternative embodiment, the flexible conductive circuitry pattern used with flexible circuitry manufacturing techniques.

Figure 1:
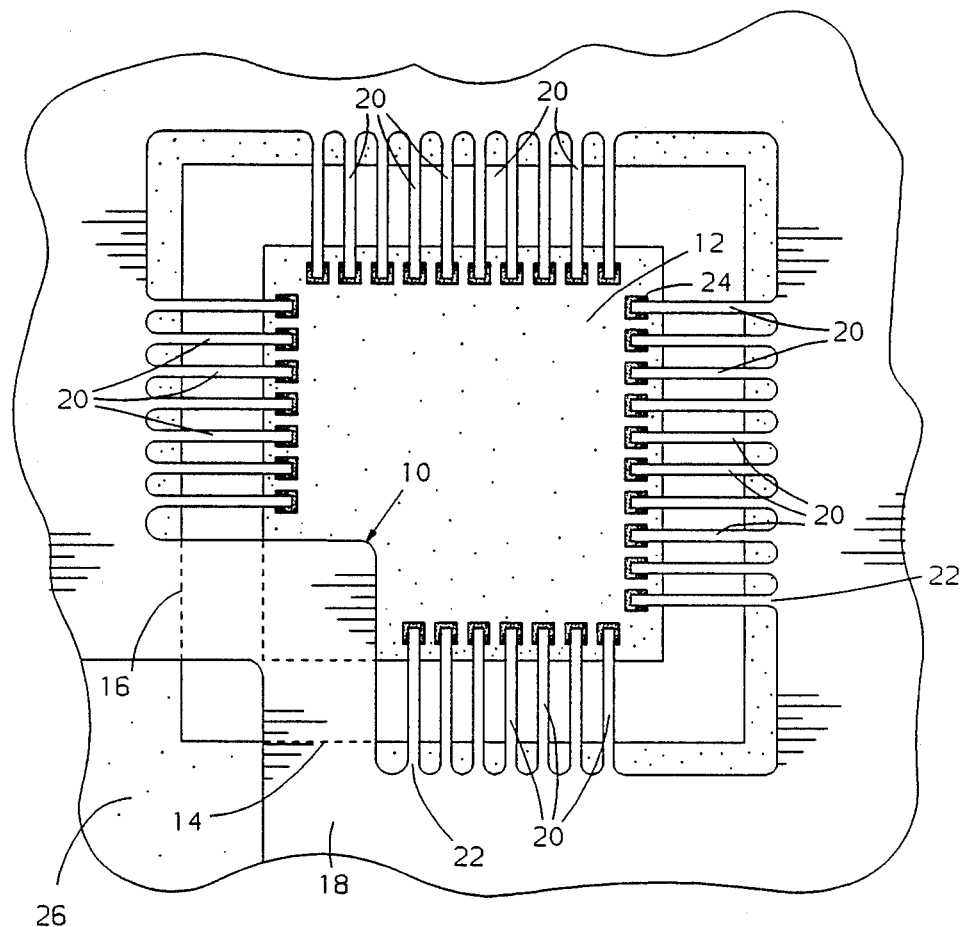
FIG. 1 is a plan view of an electromagnetic interference shield made in accordance with a preferred embodiment of this invention using either tape automated bonding or flexible circuitry manufacturing techniques.

As illustrated in FIG. 1, a shield 10 is provided which is suitable for shielding propagation of electromagnetic interference or radio frequency interference generated by an offending component on a monolithic integrated circuit chip 12 or, alternatively, protect an integrated circuit from receiving the detrimental interference which is generated elsewhere. The proposed shield 10 is identical for both situations; i.e., when the shield 10 prevents propagation of interference waves from an offending component, or when the shield 10 protects a component from receiving the interference. Therefore, for illustrative and simplicity purposes only, the first embodiment will be discussed in detail. The shield 10 is electrically conductive and has a first end 14 and a second end 16, both ends 14 and 16 being integrally connected to an electrically conductive tape 18. The electrically conductive tape 18 comprises a plurality of electrically conductive strips 20 suitable for use with tape automated bonding or flexible circuitry manufacturing techniques.

The electrically conductive interference shield 10 is located over the offending components on (not shown for clarity purposes) the integrated circuit chip 12, and is sufficiently large to shield any electromagnetic interference or radio frequency interference generated by the underlying offending components. The interference shield 10 is maintained at a predetermined, primarily constant, electrical potential, such as ground potential, with respect to the underlying integrated circuit chip. In the preferred embodiment, the shield eliminates or substantially reduces the propagation of any interfering waves generated by the offending component at their point of origin, thereby protecting the surrounding components on the integrated circuit chip 12. Alternatively, the interference shield 10 may be used to shield the sensitive, non-offending component from the interference waves generated by an offending component elsewhere on the integrated circuit 12.

The embodiment shown in FIG. 1, wherein the electrically conductive shield 10 is disposed over a corner of the integrated circuit chip 12, is preferred for practical reasons, although alternative embodiments are also foreseeable. The shield 10 extends out over the underlying offending component on the integrated circuit 12 and, therefore, must be either self-supporting or anchored to the integrated circuit chip 12. Hence, the preferred size of the shield 10 must balance the two competing concerns to minimize the amount of material which must be self-supported or anchored, while maximizing the shield's 10 cross-sectional area of shielding protection.

Figure 2:
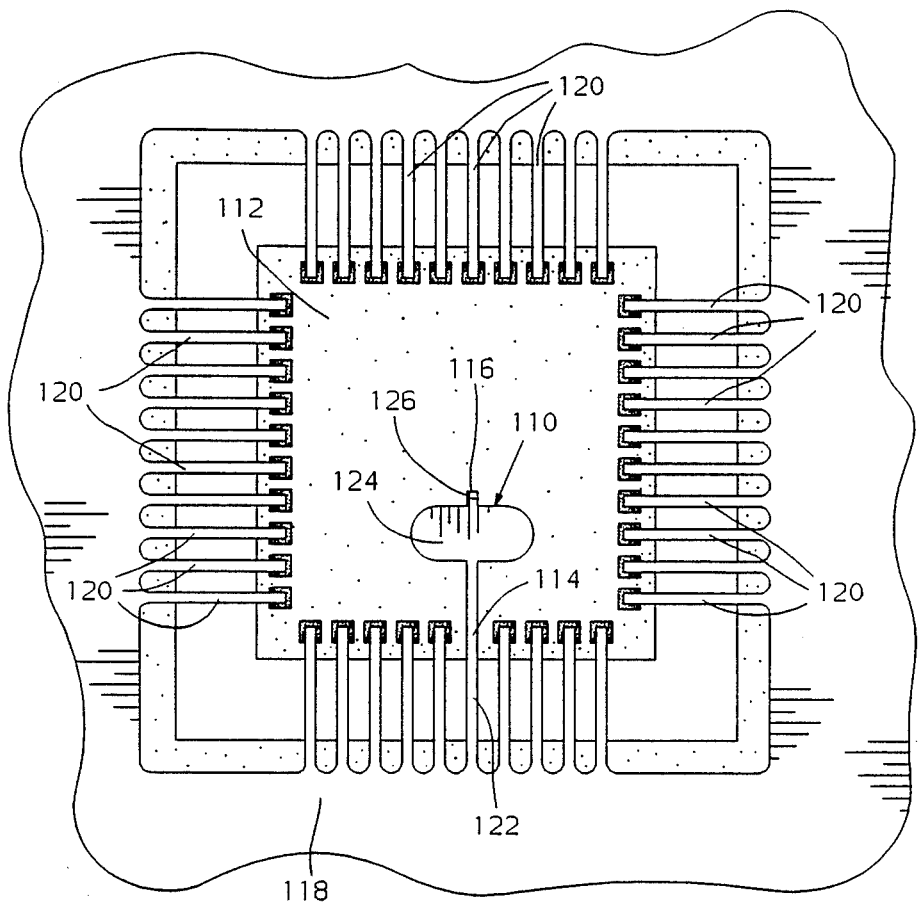
FIG. 2 is a plan view of an electromagnetic interference shield made in accordance with an alternative embodiment of this invention using either tape automated bonding or flexible circuitry manufacturing techniques.

Other embodiments of this shield 10 are also contemplated. As illustrated in FIG. 2, an example is shown where the shield 110 is analogously and integrally connected to an electrically conductive tape 118 comprising a plurality of electrically conductive strips 120 suitable for use with either tape automated bonding or flexible circuitry manufacturing techniques. The shield 110 comprises a single conductive strip 122 having a first end 114 which is integral with the electrically conductive tape 118 and a second end 116 which has a shielding region 124 which extends out over the offending or, alternatively, receiving, component (not shown) on the integrated circuit chip 112. The shielding region 124 of the shield 110 which extends out over the offending component may be electrically connected to the underlying integrated circuit 112 by means of an electrical pin 126, or it may not be physically connected at its second end 116, thereby extending freely over the offending component and integrated circuit 112. This embodiment is less preferred because one would have to prevent the unsupported shield 110 from contacting the underlying integrated circuit 112 or offending component so as to prevent any electrical shorting out of the circuitry. The shield 110 is maintained at a constant electrical potential with respect to the underlying chip 112. An advantage of electrically connecting the shield 110 to ground potential at the integrated circuit 112 is that this configuration reduces detrimental transmission line effects.

Figure 3:
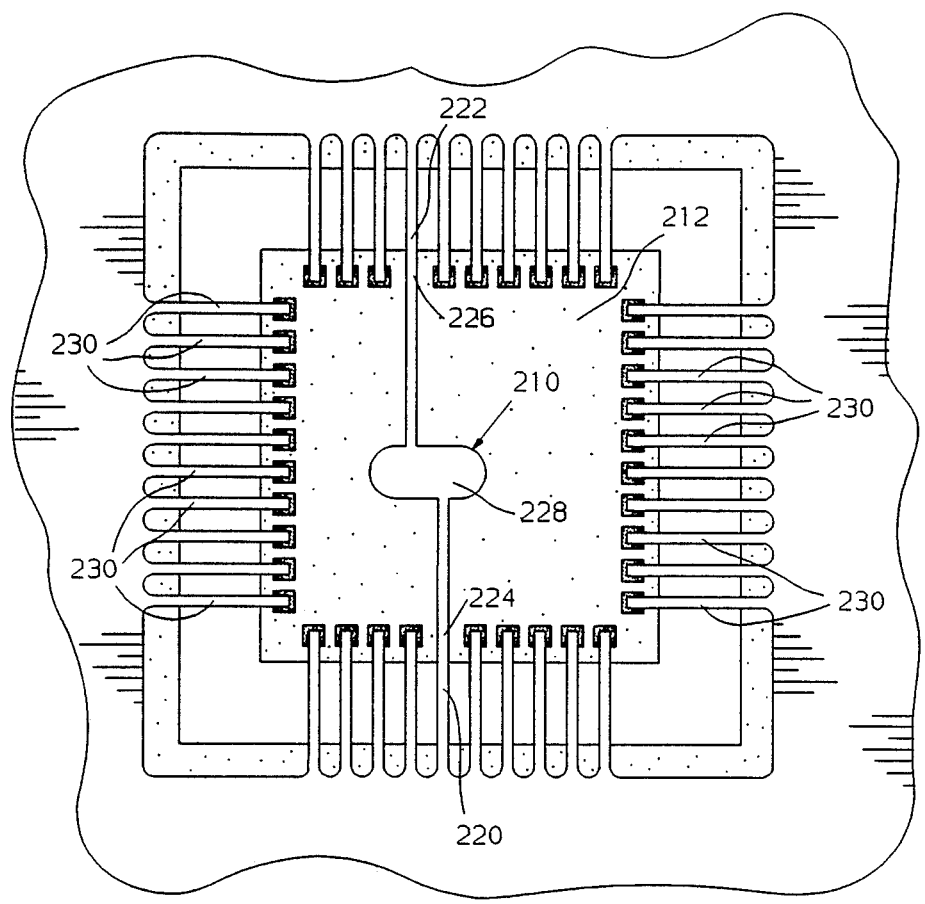
FIG. 3 is a plan view of an electromagnetic interference shield made in accordance with an alternative embodiment of this invention using either tape automated bonding or flexible circuitry manufacturing techniques.

Another embodiment is illustrated in FIG. 3 and contemplates the shield 210 being supported by two conductive fingers 220 and 222 across opposite sides, or alternatively adjacent sides, of the integrated circuit 212. In this embodiment, the shield 210 is unsupported over that region of the integrated circuit 212 having the offending component and is electrically connected to the substrate at regions 224 and 226 which are away from the shielded region 228. This embodiment is not as preferred, since one would have to ensure that the electrically conductive shield 210 will not twist or rotate and contact the underlying integrated circuit 212 or components, so as to electrically short out the circuitry.

The electromagnetic interference shield, 10, 110 or 210, as typified by any of the preferred embodiments, is compatible with either tape automated bonding or flexible circuitry manufacturing techniques. Using either manufacturing technique, the inner leads required for either of these manufacturing techniques are typified by the electrically conductive strips 20, 120 and 230 shown in FIGS. 1-3, respectively. The Figures are representative of the various embodiments of the electromagnetic shield 10, 110 and 210, respectively, using either manufacturing technique. For illustrative purposes, we will discuss the manufacturing techniques in reference to FIG. 1.

In tape automated bonding, a TAB tape 18 is provided which comprises many individual long, slender inner leads 20 attached to, and extending out from, generally wider, larger outer leads 22. An individual inner lead 20 on the TAB tape 18 is bonded to the integrated circuit 12 at a bonding pad 24, so as to form an inner lead bond. The bond pad 24 on the integrated circuit 12 typically comprises a gold bump; however, other suitable electrically conductive materials, such as palladium, copper or silver, may also be used. After alignment of the inner lead 20 with the bond pad 24 having the gold bumps, the inner leads 20 are then thermocompression gang bonded to the integrated circuit 12 at the bond pad 24. Alternatively, the gold bump may be provided on the interconnection lead 20, subsequently aligned with the appropriate regions of the integrated circuit 12, and thermocompression gang bonded. There are typically many inner leads 20 on a single TAB tape 18 which are generally, simultaneously thermocompression gang bonded to the bond pads 24 on the integrated circuit 12 or alternatively single point bonded.

After the bonds between the integrated circuit 12 and the interconnection lead 20 are formed, the integrated circuit 12 is excised from the TAB tape 18 at a point beyond where the outer bonds (not shown) will be formed on the supporting substrate 26, so that the outer lead 22 remains electrically attached to the integrated circuit 12 at the bond pad 24 where the inner lead 20 is bonded to the integrated circuit 12. The integrated circuit 12 and bonded interconnection leads 20 are subsequently mounted on the substrate 26, if this has not already been done, and the outer bonds (not shown) are appropriately and analogously formed on the substrate 26.

This inventive electromagnetic interference shield 10 is also compatible with flexible circuitry manufacturing techniques. With flexible circuitry techniques, a flexible (FLEX) circuit consists of a patterned arrangement of conductors 20 on a flexible insulating base substrate 26 with or without cover layers. The FLEX circuit may be single or double sided, multilayered or rigidized, in addition to other possible arrangements. The FLEX circuit may be formed by several methods, such as by laminating copper foil to any of several base substrate materials, or alternatively pattern plating copper directly onto the substrate.

The FLEX circuit is advantageous in that it contains both the internal and external integrated circuit chip interconnections. The inner leads 20 are adjacent to and an integral part of the flexible circuitry pattern. The inner lead bonds 24 are formed analogously to the way in which the inner lead bonds are formed using the TAB tape as outlined above. Outer leads are not required, as with the TAB tape technology, because the individual inner leads 20 are incorporated within the flexible circuitry pattern and supporting substrate 26. Therefore, there are no outer leads. The flexible circuitry pattern is supported by and electrically connected to the flexible substrate 26 at the appropriate regions, making outer lead bonds unnecessary. The use of the FLEX circuitry permits smaller integrated circuits and interconnection patterns because the chip is mounted directly onto the patterned substrate, or alternatively directly onto a heat sink, and is characterized by improved electrical integrity because of the fewer amount of electrical connections required.

A desirable feature of the present invention is that the provided electromagnetic interference shield 10 is compatible with and can be incorporated in either the TAB tape or FLEX circuit for use with either the tape automated bonding or flexible circuitry manufacturing technologies.

FIG. 1 illustrates the preferred electromagnetic interference shield 10 and a plurality of electrical interconnection leads 20. The interconnection leads 20 could be part of a TAB tape 18 wherein an outer bond would be formed between the illustrated inner lead 20 and the supporting substrate 26 at an outer bond pad (not shown) and subsequently the TAB tape 18 excised at a point beyond the outer bond pad, or analogously part of a FLEX circuit wherein the illustrated inner lead would be integral with the flexible conductive patterns which are supported by the flexible substrate, thereby requiring no outer bond.

As shown in FIG. 1, a plurality of electrical interconnection leads 20 for electrically interconnecting discrete regions on a monolithic integrated circuit chip 12 are provided. The interconnection leads 20 are preferably formed from copper due to its availability and practicality; however, other suitable electrically conductive materials, such as silver or aluminum, may also be used.

The preferred electromagnetic interference shield 10 preferably comprises the same material as the interconnection lead 20, i.e., copper, so that the shield 10 and interconnection leads 20 may be formed concurrently for ease of manufacturing and assembly. However, any suitable electrically conductive material may be used for both the shield and interconnection leads.

The shielding effect of a metal is dependent on the conductivity and magnetic permeability of the material, as well as on the frequency of the interference waves. Hence, practically all metals are suitable for shielding purposes. In general, when the offending component is shielded completely, the coupling resistance drops sharply with increasing frequency. Coupling resistance is generally defined as the quotient of the high-frequency voltage present at the exterior of the shield and the high frequency current flowing on the inside of the shield. Therefore, with complete screening, the shielding becomes more effective at higher frequencies. With incomplete shielding, such as when a gap in the shield exists, the coupling resistance increases with frequency, consequently, the effectiveness of the shielding becomes poorer with higher frequencies. Therefore, in general, it is desirable to provide a shield which is as complete as possible, particularly if the interfering wave is at a high frequency.

The electromagnetic interference shield 10 in accordance with our invention, although it does not surround the offending component completely, provides adequate shielding characteristics by covering the entire underlying component on the integrated circuit 12. It is desirable to provide a shield 10 which has at least as large a cross section as the underlying offending component. Theoretically, the shield 10 can have a cross section as large as the underlying integrated circuit 12, however, a restraining factor being the practicality of forming a large shield 10 and the concern that the shield 10 will contact the integrated circuit 12 in an inappropriate region so as to cause electrical shorts.

As a result of the interference shield 10 designed in accordance with the present invention, propagation of interfering electromagnetic or radio frequency waves are eliminated or significantly reduced. In addition, the present invention is entirely compatible with tape automated bonding and flexible circuitry technologies, thereby utilizing materials that are integral with current design, and manufacturing steps. Lastly, this invention eliminates the need for costly integrated circuit process steps which add metallization layers on the integrated circuit to accomplish the same reduction in interference waves, thereby providing improved electrical integrity and characteristics.

While our invention has been described in terms of preferred embodiments, it is apparent that other forms could be adopted by one skilled in the art, such as by shielding the sensitive component in the manner described here, or by using a shield of an alternative cross-sectional design. Accordingly, the scope of our invention is to be limited only by the following claims.

The embodiments of the invention in which an exclusive property or privilege is claimed are defined as follows:

1. An electrically conductive tape suitable for electrically interconnecting a plurality of bonding sites on a monolithic integrated circuit chip, the electrically conductive tape comprising:

a plurality of electrically conductive strips having a first end and a second end, said strips being integral with the electrically conductive tape at said first end, said second end provides the bonding site for electrical connection between said electrically conductive strips and the monolithic integrated circuit chip;

and an electrical shield having a first end and a second end, said electrical shield being integral with the electrically conductive tape at said first end and said second end, said electrical shield being maintained at a predetermined, primarily constant, electrical potential with the monolithic integrated circuit chip, and said electrical shield having a portion disposed over a predetermined region of the monolithic integrated circuit chip, said portion being sufficiently large to shield electromagnetic interference generated from electromagnetic generating components on the monolithic integrated circuit yet not so large as to shield the entire monolithic integrated circuit.

2. An electrically conductive tape as recited in claim 1 wherein said electrical conductor comprises copper.

3. An electrically conductive tape as recited in claim 1 suitable for use with tape automated bonding manufacturing techniques.

4. An electrically conductive tape as recited in claim 1 suitable for use with flexible circuitry manufacturing techniques.

5. An interconnection lead suitable for shielding electromagnetic interference generated by offending components on a monolithic integrated circuit chip, said interconnection lead comprising:

a first end and a second end, said first and second ends are physically and electrically integral with an electrically conductive tape;

means for maintaining a predetermined, primarily constant, electrical potential between said interconnection lead and the monolithic integrated circuit chip; and wherein a portion of said interconnection lead provided between said first and second ends is disposed over the offending components of the monolithic integrated circuit chip and is sufficiently large to shield electromagnetic interference generated by the offending components yet not so large as to shield the entire monolithic integrated circuit.

6. An interconnection lead as stated in claim 5 wherein said interconnection lead comprises copper.

* * * * *